United States Patent
Seo et al.

(10) Patent No.: US 8,921,837 B2
(45) Date of Patent: Dec. 30, 2014

(54) ORGANIC LIGHT EMITTING DISPLAY DEVICE WITH LIGHT COMPENSATION LAYER

(71) Applicant: LG Display Co., Ltd., Seoul (KR)

(72) Inventors: Hyun-Sik Seo, Goyang-si (KR); Jeong-Hoon Lee, Gumi-si (KR); Dae-Won Kim, Goyang-si (KR); Yong-Ho Choi, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/706,216

(22) Filed: Dec. 5, 2012

(65) Prior Publication Data

US 2013/0153870 A1    Jun. 20, 2013

(30) Foreign Application Priority Data

Dec. 14, 2011 (KR) .................. 10-2011-0134862

(51) Int. Cl.
  *H01L 51/52* (2006.01)
  *H01L 27/32* (2006.01)
  *H01L 27/12* (2006.01)

(52) U.S. Cl.
  CPC ........ *H01L 51/5262* (2013.01); *H01L 51/5275* (2013.01); *H01L 27/3272* (2013.01); *H01L 27/322* (2013.01); *H01L 27/1248* (2013.01)
  USPC .......................................................... 257/40

(58) Field of Classification Search
  CPC combination set(s) only.
  See application file for complete search history.

(56) References Cited

U.S. PATENT DOCUMENTS

2008/0042135 A1* 2/2008 Ryu et al. .................. 257/59

FOREIGN PATENT DOCUMENTS

| JP | 62-170190 | | 7/1987 |
|---|---|---|---|
| JP | 2001-052873 | A | 2/2001 |
| JP | 2004-31102 | A | 1/2004 |
| JP | 2004-31242 | A | 1/2004 |
| JP | 2005-200680 | A | 7/2005 |
| JP | 2007-188808 | A | 7/2007 |
| JP | 2009-031393 | A | 2/2009 |
| JP | 2010-166063 | A | 7/2010 |
| JP | 2010-218718 | A | 9/2010 |
| KR | 10-2006-0125652 | | 12/2006 |
| KR | 10-2007-0054806 | A | 5/2007 |
| KR | 10-0945468 | A | 3/2010 |
| WO | WO 2010/038514 | A1 | 2/2010 |

OTHER PUBLICATIONS

Japanese Patent Office, Office Action, Japanese Patent Application No. 2012-237516, Nov. 14, 2013, nine pages.
Japanese Office Action, Japanese Application No. 2012-237516, Jul. 29, 2014, 7 pages.

* cited by examiner

*Primary Examiner* — Selim Ahmed
(74) *Attorney, Agent, or Firm* — Fenwick & West LLP

(57) ABSTRACT

The present invention is to provide an organic light emitting display device for preventing a thin-film transistor from being deteriorated due to hydrogen when forming a light compensation layer configured to enhance viewing angle, and the organic light emitting display device may include a first substrate and a second substrate comprising a plurality of pixels; a thin-film transistor formed at each pixel of the first substrate; a color filter layer formed at each pixel; an insulating layer formed on the color filter layer; a light compensation layer formed on the insulating layer and made of a material containing no hydrogen; a pixel electrode formed on the light compensation layer of each pixel; an organic light emitting unit formed on the pixel electrode to emit light; and a common electrode formed on the organic light emitting unit.

6 Claims, 15 Drawing Sheets

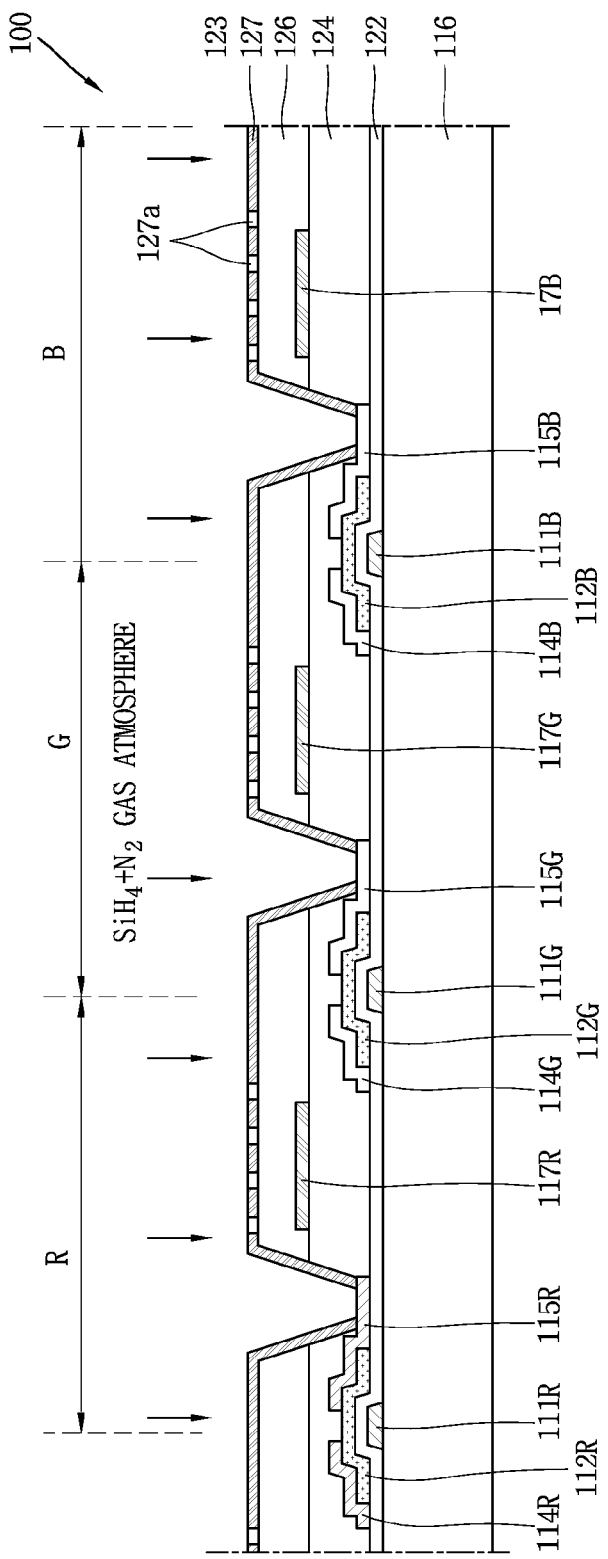

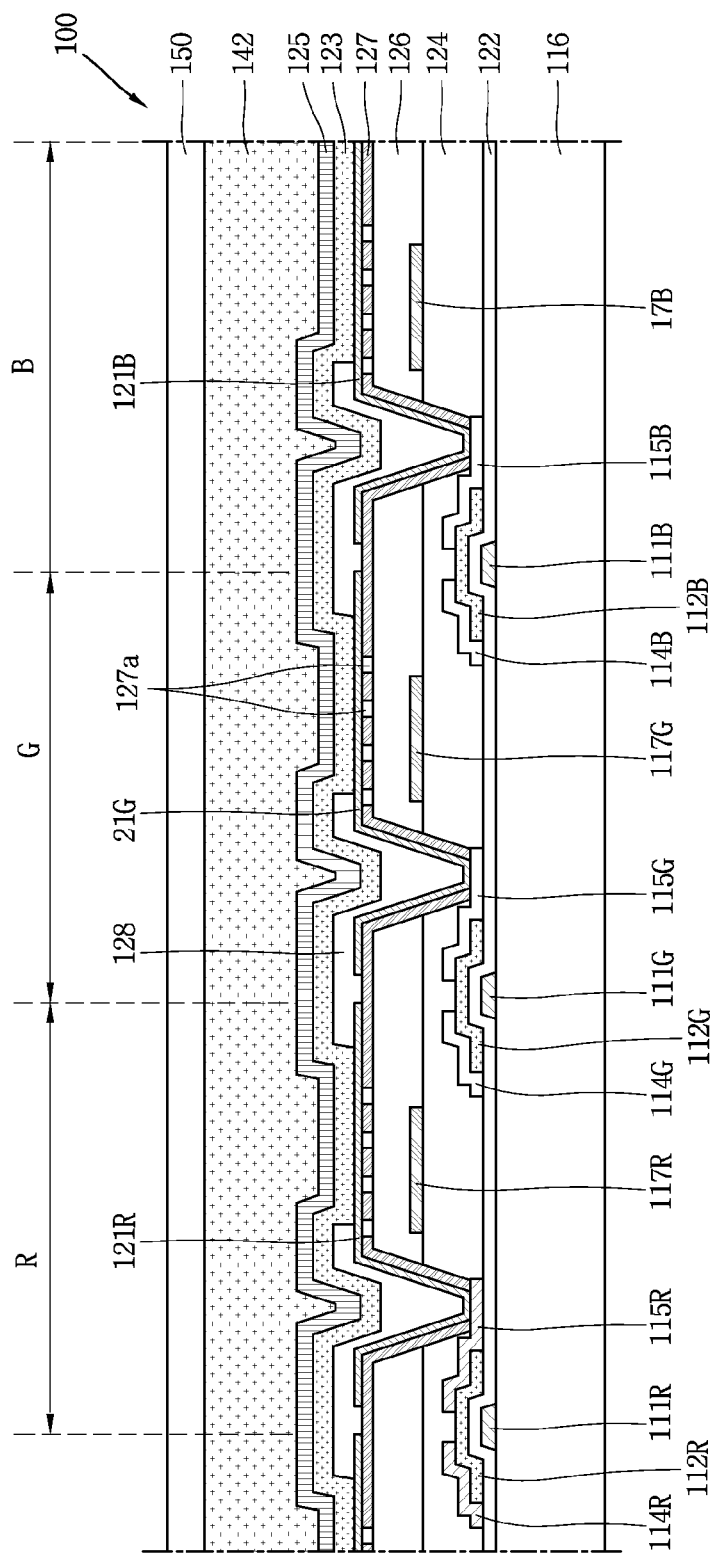

ORGANIC LIGHT EMITTING DISPLAY DEVICE WITH LIGHT COMPENSATION LAYER

CROSS-REFERENCE TO RELATED APPLICATIONS

This application claims the benefit of Korean Patent Application No. 10-2011-013486, filed on Dec. 14, 2011, which is hereby incorporated by reference for all purposes as if fully set forth herein.

BACKGROUND OF THE INVENTION

1. Field of the Invention

The present invention relates to an organic light emitting display device, and more particularly, to an organic light emitting display device and a fabrication method thereof capable of enhancing color viewing angle characteristics.

2. Description of the Related Art

In recent years, since an organic light emitting display device using poly-phenylene vinylene (PPV) which is one of conjugate polymers has been developed, studies on organic materials such as a conjugate polymer having conductivity have been actively carried out. Studies for applying such an organic material to a thin-film transistor, a sensor, a laser, a photoelectric element, and the like have been continuously carried out, and among them studies on organic light emitting display devices have been most actively carried out.

In case of light emitting display devices made of phosphor-based inorganic materials, an operating voltage 200 V is required and the display device is fabricated by a vacuum deposition process. This causes difficulty in fabricating a large-sized display (particularly in exhibiting blue light emitting characteristics) and disadvantage of high fabrication cost. However, organic light emitting display devices made of organic materials have been highly regarded as the next generation display devices due to advantages such as the facilitation of a large-sized screen, the convenience of a fabrication process, and particularly easy implementation of blue light emission, as well as allowing the development of a flexible light emitting display device.

At present, similar to liquid crystal display devices, studies on active matrix organic light emitting display devices having an active driving element for each pixel have been actively carried out to implement a flat panel display. In particular, in recent years, a color filter layer for implementing various colors has been formed on a substrate formed with thin-film transistors, thus allowing light being emitted from the light emitting unit to pass through the color filter layer to display various colors. However, in an organic light emitting display device having such a color filter on TFT (COT) structure, a color change is produced according to the viewing angle, thereby causing a problem of narrow viewing angle.

SUMMARY OF THE INVENTION

The present invention is contrived to solve the aforementioned problem. An object of the present invention is to provide an organic light emitting display device and a fabrication method thereof in which a light compensation layer is formed and has an enhanced viewing angle characteristic.

Another object of the present invention is to provide an organic light emitting display device and a fabrication method thereof in which a light compensation layer is formed in a gas atmosphere containing no hydrogen, thereby preventing a thin-film transistor from being deteriorated due to hydrogen infiltration into a channel layer of the thin-film transistor.

Still another object of the present invention is to provide an organic light emitting display device and a fabrication method thereof in which a hole for discharging foreign substances is formed on the light compensation layer, thereby efficiently discharging foreign substances during the vacuum cure process.

In order to accomplish the foregoing object, an organic light emitting display device according to the present invention may include a first substrate and a second substrate comprising a plurality of pixels; a thin-film transistor formed on the first substrate; a first insulating layer formed on the first substrate including the thin-film transistor; a color filter layer formed on the first insulating layer in the pixel region; a second insulating layer formed on the first substrate including the color filter layer; a light compensation layer formed on the second insulating layer and made of a material containing no hydrogen, wherein the light compensation layer comes into contact with a pad of a drain of the thin-film transistor; a pixel electrode formed on the light compensation layer of each pixel region; an organic light emitting unit formed on the pixel electrode to emit light; and a common electrode formed on the organic light emitting unit.

The organic light emitting display device further comprises a plurality of holes formed on the light compensation layer to discharge foreign substances. The holes are formed in outer wall of each pixel regions.

The light compensation layer is made of SiNx, indium tin oxide (ITO), indium zinc oxide (IZO), and the like, having a refractive index of 1.5 to 2.7, and the SiNx is deposited with a thickness of 1500 to 2000 Å. A plurality of holes are formed at the light compensation layer to discharge foreign substances during the vacuum cure process.

Furthermore, a method of fabricating an organic light emitting display device according to the present invention may include providing a first substrate and a second substrate comprising a plurality of pixels; forming a thin-film transistor at each pixel of the first substrate; forming a first insulating layer on the first substrate including the thin-film transistor; forming a color filter layer on the first insulating layer in the pixel region; forming a second insulating layer on the first substrate including the color filter layer; forming a light compensation layer made of SiNx in a gas atmosphere mixed with $SiH_4$ and $N_2$ on the second insulating layer and made of a material containing no hydrogen, wherein the light compensation layer comes into contact with a pad of a drain of the thin-film transistor; forming a pixel electrode on the light compensation layer of each pixel region; forming an organic light emitting unit for emitting light on the light compensation layer; forming a common electrode on the organic light emitting unit; and bonding the first substrate to the second substrate.

At this time, the method according to the present invention may further include forming a SiNx layer in a gas atmosphere mixed with $SiH_4$ and $NH_3$. The SiNx is formed by alternatively changing the gas atmosphere mixed with $SiH_4$ and $N_2$ and the gas atmosphere mixed with $SiH_4$ and $HN_3$.

Furthermore, the foregoing method may further include performing vacuum curing on the layers formed subsequent to forming the pixel electrode for a predetermined period of time in a vacuum state to discharge foreign substances contained in the formed layers through the holes.

First, according to the present invention, a transparent light compensation layer having a refractive index of 1.5 to 2.7 may be formed, thereby enhancing a viewing angle characteristic.

Second, according to the present invention, the light compensation layer may be formed in a gas atmosphere containing no hydrogen, and thus hydrogen infiltration into a channel layer of the thin-film transistor can be prevented when forming the light compensation layer, thereby preventing a thin-film transistor from being deteriorated due to hydrogen infiltration.

Third, according to the present invention, a hole for discharging foreign substances may be formed on the light compensation layer to efficiently discharge foreign substances during the vacuum cure process, thereby preventing a failure due to foreign substances.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

FIGS. 5A through 5F are views illustrating a method of fabricating an organic light emitting display device according to a second embodiment of the present invention.

DETAILED DESCRIPTION OF THE INVENTION

Hereinafter, the present invention will be described in detail with reference to the accompanying drawings.

Figure 1:
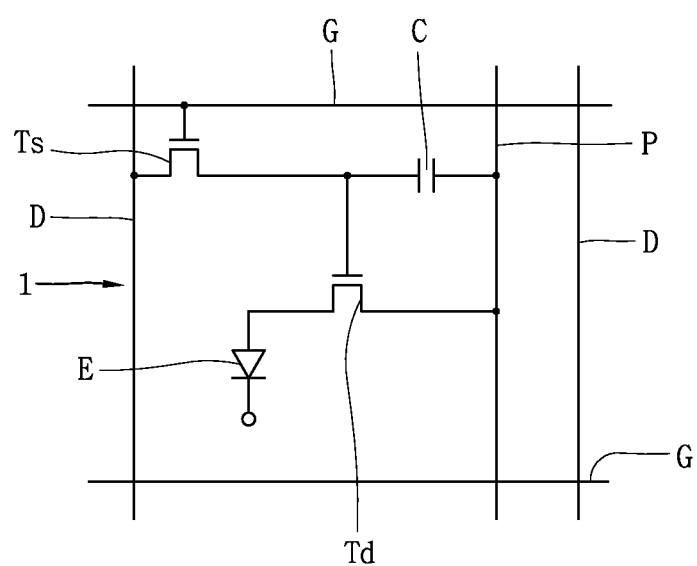
FIG. 1 is a view illustrating an equivalent circuit diagram of an organic light emitting display device according to the present invention.

FIG. 1 is a view illustrating an equivalent circuit diagram of an organic light emitting display device according to the present invention. As illustrated in FIG. 1, an organic light emitting display device 1 may be composed of a plurality of pixels defined by a gate line (G) and a data line (D) crossing in the vertical and horizontal directions, respectively, and a power line (P) arranged in parallel with the data line (D).

A switching thin-film transistor (Ts), a driving thin-film transistor (Td), a capacitor (C), and an organic light emitting element (E) may be provided within each pixel. A gate electrode of the switching thin-film transistor (Ts) is connected to the data line (D), and a drain electrode thereof is connected to a gate electrode of the driving thin-film transistor (Td). Furthermore, a source electrode of the driving thin-film transistor (Td) is connected to the power line (P) and a drain electrode thereof is connected to the light emitting element (E).

When a scan signal is received through the gate line (G) in the organic light emitting display device having the foregoing configuration, the signal is applied to a gate electrode of the switching thin-film transistor (Ts) to drive the switching thin-film transistor (Ts). As the switching thin-film transistor (Ts) is driven, a data signal being received through the data line (D) is received at a gate electrode of the driving thin-film transistor (Td) through the source electrode and drain electrode to drive the driving thin-film transistor (Td).

At this time, a current flows through the power line (P), and as the driving thin-film transistor (Td) is driven, the current of the power line (P) is applied to the light emitting element (E) through the source electrode and drain electrode. The size of the current outputted through the driving thin-film transistor (Td) varies according to a voltage between the gate electrode and the drain electrode.

As an organic light emitting element, the light emitting element (E) emits light as the current is received through the driving thin-film transistor (Td) to display an image. The intensity of light emission varies according to the intensity of current being applied thereto, and thus the intensity of light can be controlled by controlling the intensity of the current.

Figure 2:
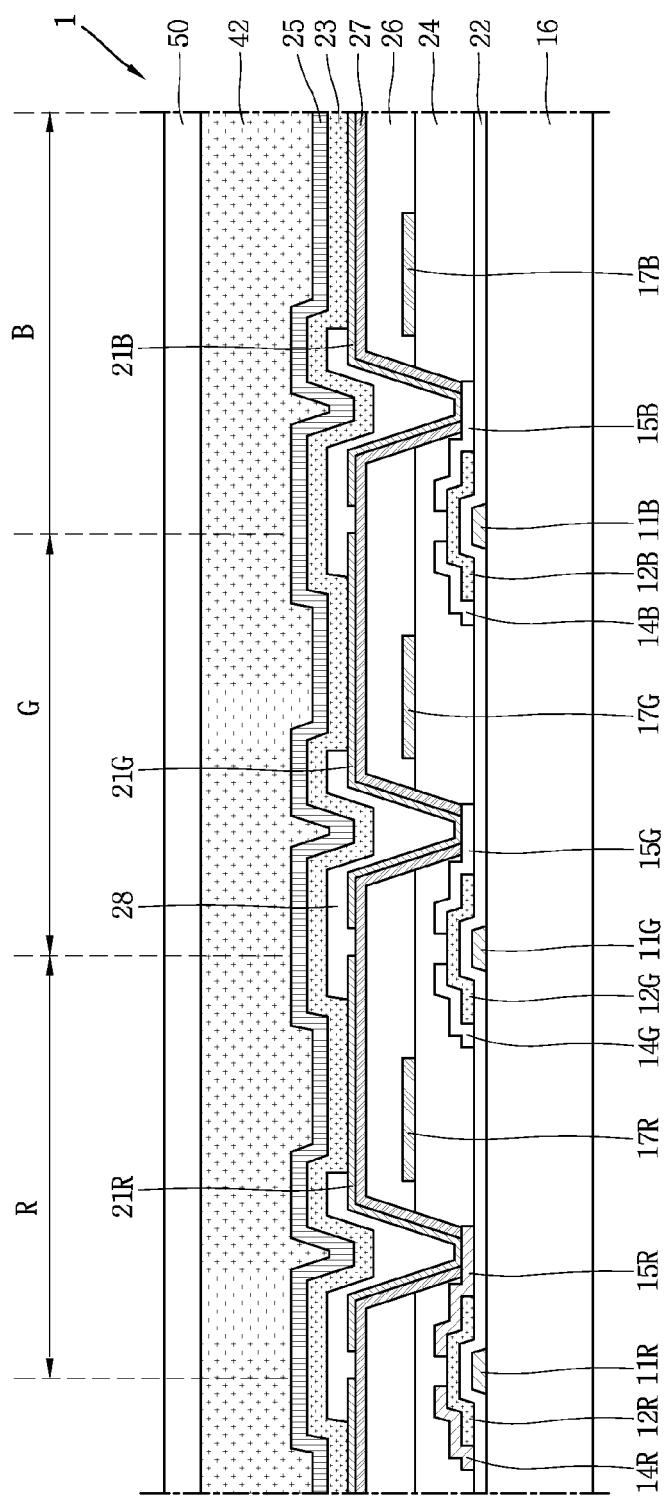
FIG. 2 is a cross-sectional view illustrating the structure of an organic light emitting display device according to a first embodiment of the present invention.

FIG. 2 is a cross-sectional view illustrating the actual structure of an organic light emitting display device according to a first embodiment of the present invention. The structure of an organic light emitting display device according to this embodiment will be described below with reference to the drawing.

As illustrated in FIG. 2, an organic light emitting display device according to this embodiment may include a pixel R for outputting red light, and a pixel G for outputting green light, and a pixel B for outputting blue light. Though not shown in FIG. 2, an organic light emitting display device according to the present invention may include a pixel W for outputting white light. In this case, the pixel W outputs white light to enhance the entire luminance of the organic light emitting display device.

A color filter layer is formed at each pixel (R, G, B) to output white light being outputted from the organic light emitting unit as a specific color light. But when the pixel W is disposed thereon, white light is outputted as it is from the pixel W without requiring such a color filter layer.

As illustrated in FIG. 2, a first substrate 16 made of a transparent material such as glass or plastic is divided into R, G, B pixels, and a thin-film transistor is formed at each of the R, G, B pixels.

The driving thin-film transistor may include a gate electrode (11R, 11G, 11B) formed at the pixel (R, G, B), respectively, on the first substrate 16, and a semiconductor layer (12R, 12G, 12B) formed over the entire surface of the first substrate 16 formed with the gate electrode (11R, 11G, 11B), and a source electrode (14R, 14G, 14B) and a drain electrode (15R, 15G, 15B) formed on the semiconductor layer (12R, 12G, 12B). Though not shown in the FIG. 2, an etching stopper is formed at part of the upper surface of the semiconductor layer (12R, 12G, 12B) to prevent the semiconductor layer (12R, 12G, 12B) from being etched during the etching process of the source electrode (14R, 14G, 14B) and drain electrode (15R, 15G, 15B).

The gate electrode (11R, 11G, 11B) may be formed of a metal such as Cr, Mo, Ta, Cu, Ti, Al or Al-alloy, and the gate insulating layer 22 may be a single layer made of an inorganic material such as $SiO_2$ or SiNx or a double layer made of $SiO_2$ and SiNx. The semiconductor layer (12R, 12G, 12B) may be formed of an amorphous semiconductor (a-Si), a crystalline semiconductor, a transparent oxide semiconductor such as indium gallium zinc oxide (IGZO), or an organic semiconductor. Furthermore, the source electrode (14R, 14G, 14B) and drain electrode (15R, 15G, 15B) may be formed of Cr, Mo, Ta, Cu, Ti, Al or Al-alloy.

A first insulating layer 24 may be formed on the first substrate 16 formed with the driving thin-film transistor. The first insulating layer 24 may be formed of an inorganic material with a thickness of about 4500 Å. A R-color filter layer 17R, a G-color filter layer 17G, and a B-color filter layer 17B are formed on the R, G, B pixels, respectively, of the first insulating layer 24.

A second insulating layer 26 is formed on the R-color filter layer 17R, G-color filter layer 17G, and B-color filter layer 17B. As an overcoat layer for planarizing the first substrate 16, the second insulating layer 26 may be formed of an organic insulating material such as photoacryl with a thickness of about 3 μm.

A light compensation layer 27 is formed on the second insulating layer 26. The light compensation layer 27 allows light entered into the color filter layer (17R, 17G, 17B) to be refracted to enhance the viewing angle characteristic of light, and may be formed by depositing the SiNx layer having a refractive index of 1.5 to 2.7 with a thickness of 1500-2000 Å. The light compensation layer 27 is not limited to the SiNx layer, and may be formed of any transparent material having a refractive index of 1.5 to 2.7. For example, transparent indium tin oxide (ITO) or indium zinc oxide (IZO) may be used as the light compensation layer 27. The light compensation layer 27 is formed over the entire surface of the first substrate 10, and thus, the composition ratio of ITO or IZO may be preferably controlled to minimize electrical conductivity, thereby removing the conductivity.

The light compensation layer 27 is a layer containing no hydrogen, and for example, the light compensation layer 27 may be formed in an atmosphere containing no hydrogen when forming a SiNx layer using the light compensation layer 27, thereby preventing a thin-film transistor from being deteriorated due to hydrogen infiltration into a channel layer of the thin-film transistor.

A pixel electrode (21R, 21G, 21B) is formed on the pixel (R, G, B), respectively, on the light compensation layer 27. A contact hole 29 is formed on the first insulating layer 24 and second insulating layer 26 of the drain electrode (15R, 15G, 15B) of a thin-film transistor formed on the pixel (R, G, B), respectively, and thus, the light compensation layer 27 and pixel electrode (21R, 21G, 21B) is formed on the contact hole 29 (see FIG. 3D). The pixel electrode (21R, 21G, 21B) is electrically connected to the exposed drain electrode (15R, 15G, 15B), respectively, of the thin-film transistor.

Furthermore, a bank layer 28 is formed at each pixel boundary region on the second insulating layer 26. Functioning as a partition wall, the bank layer 28 partitions off each pixel to prevent a specific color light outputted from the adjacent pixel from being mixed. In addition, the bank layer 28 fills up a portion of the contact hole 29 to decrease the step, thereby preventing a failure from occurring at the organic light emitting unit 23 due to an excessive step during the formation of the organic light emitting unit 23.

The pixel electrode (21R, 21G, 21B) is made of a transparent metal oxide material such as indium tin oxide (ITO) or indium zinc oxide (IZO). In this invention, the pixel electrode (21R, 21G, 21B) can be formed with a thickness of about 500 Å on the pixels (R, G, B), respectively.

The pixel electrode (21R, 21G, 21B) is brought directly into contact with the light compensation layer 27. Accordingly, when the light compensation layer 27 is formed of ITO or IZO, a signal applied to the pixel electrode (21R, 21G, 21B) is applied throughout the entire surface of the first substrate 10, and thus an electrical conductivity of the ITO or IZO formed as the light compensation layer 27 is much lower than that of the ITO or IZO formed as the pixel electrode (21R, 21G, 21B).

The organic light emitting unit 23 may include a white organic light emitting layer for emitting white light. The white organic light emitting layer may be formed such that a plurality of organic materials for emitting R, G, B monochrome lights, respectively, are mixed with one another, or may be formed such that a plurality of light emitting layers for emitting R, G, B monochrome lights, respectively, are deposited on one another. Though not shown in the FIG. 2, the organic light emitting unit 23 may be formed with an organic light emitting layer as well as with an electron injection layer and a hole injection layer for injecting electrons and holes, respectively, and an electron transport layer and a hole transport layer for transporting the injected electrons and holes to the organic light emitting layer, respectively.

A common electrode 25 is formed over the entire surface of the first substrate 16 on the organic light emitting unit 23. The common electrode 25 is made of materials such as Ca, Ba, Mg, Al, or Ag.

The common electrode 25 is a cathode of the organic light emitting unit 23 and the pixel electrode (21R, 21G, 21B) is an anode thereof. When a voltage is applied to the common electrode 25 and pixel electrode (21R, 21G, 21B), electrons are injected to the organic light emitting unit 23 from the common electrode 25, and holes are injected to the organic light emitting unit 23 from the pixel electrode (21R, 21G, 21B) to generate excitons within the organic light emitting layer. As the excitons are decayed, light corresponding to a difference between the lowest unoccupied molecular orbital (LUMO) and the highest occupied molecular orbital (HOMO) is produced and emitted to the outside (toward the first substrate 16 in the drawing). Red light, green light, and blue light are emitted from R, G, B light emitting layers, respectively, contained in the organic light emitting layer, and those lights are mixed to emit white light. The emitted white light outputs only the light of a color corresponding to the relevant pixel while penetrating the color filter layer (17R, 17G, 17B), respectively.

An adhesive is coated at an upper portion of the common electrode 25 to form an adhesive layer 42, and a second layer 50 is disposed thereon, and thus the second layer 50 is adhered to the first substrate 16 by the adhesive layer 42.

Any material with a good adhesiveness and with a good thermal and water resistivity may be used for the adhesive, but in this invention, a thermosetting resin such as an epoxy-based compound, an acrylate-based compound, or acrylate-based rubber. The adhesive layer 42 is coated with a thickness of about 5 to 100 μm, and cured at temperatures of about 80 to 170 degrees. The adhesive layer 42 enables the first substrate 16 and second layer 50 to be bonded together, and performs the role of a sealing agent for preventing moisture from being infiltrated into an inner portion of the organic light emitting display device. Accordingly, in the detailed description of the present invention, reference numeral 42 is referred to as an adhesive, but it is only a matter of convenience, and the adhesive may be also referred to as a sealing agent.

As an encapsulation cap for sealing the adhesive layer 42, the second layer 50 may be formed with a protective film such as a polystyrene (PS) film, a polyethylene (PE) film, a polyethylene naphthalate (PEN) film, or a polyimide (PI) film. Furthermore, the second layer 50 may be made of plastic or glass, and any other material may be also used to protect the foregoing structure formed on the first substrate 16.

Though not shown in the drawing, an auxiliary electrode formed between the first substrate 16 and second layer 50 in an outer region of the organic light emitting display device to supply a common voltage to the common electrode 25 may be formed thereon.

As described above, the light compensation layer 27 is formed under the organic light emitting unit 23 to compensate white light entering the R, G, B color filter layers (17R, 17G, 17B) out of the organic light emitting unit 23, thereby enhancing the viewing angle characteristic.

The light compensation layer 27 is made of a layer containing no hydrogen, thereby preventing a thin-film transistor from being deteriorated due to hydrogen infiltration into a channel layer of the thin-film transistor during the formation of the light compensation layer 27.

Hereinafter, a method of fabricating an organic light emitting display device having the structure of FIG. 2 is described as follows.

Figure 3A:
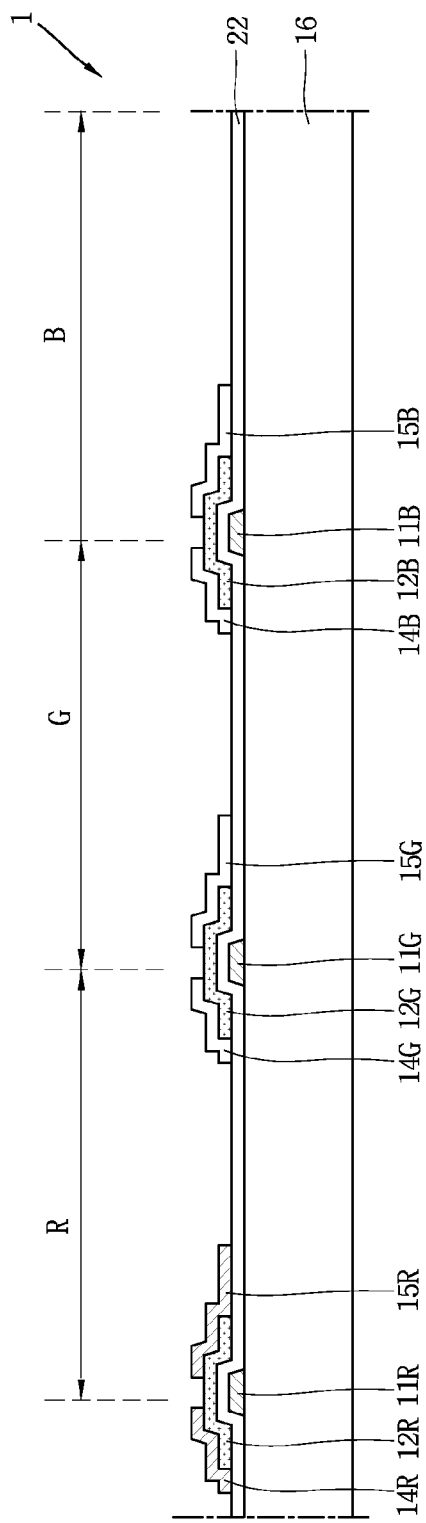
FIGS. 3A through 3F are views illustrating a method of fabricating an organic light emitting display device according to a first embodiment of the present invention.

FIGS. 3A through 3F are views illustrating a method of fabricating an organic light emitting display device according to the present invention. First, as illustrated in FIG. 3A, the first substrate 16 made of a transparent material such as glass or plastic is prepared, and then a non-transparent material having a good conductivity such as Cr, Mo, Ta, Cu, Ti, Al or Al-alloy is deposited by a sputtering process and then etched by a photolithography process to form the gate electrode (11R, 11G, 11B).

Then, an inorganic insulating material is deposited over the entire surface of the first substrate 16 by a chemical vapor deposition (CVD) process to form a gate insulating layer 22. For the gate insulating layer 22, SiNx may be formed at a thickness of about 2000 Å.

Subsequently, a semiconductor material such as an amorphous silicon (a-Si), a transparent oxide semiconductor such as indium gallium zinc oxide (IGZO), or an organic semiconductor is deposited by the CVD process and then etched to form the semiconductor layer (12R, 12G, 12B). Furthermore, though not shown in the drawing, impurities are doped into part of the semiconductor layer (12R, 12G, 12B) or amorphous silicon to which impurities have been added is deposited to form an ohmic contact layer.

Then, a non-transparent metal having a good conductivity such as Cr, Mo, Ta, Cu, Ti, Al or Al-alloy is deposited on the first substrate 16 by a sputtering process and then etched to form the source electrode (14R, 14G, 14B) and drain electrode (15R, 15G, 15B) on the semiconductor layer (12R, 12G, 12B), strictly speaking, on the ohmic contact layer.

Figure 3B:
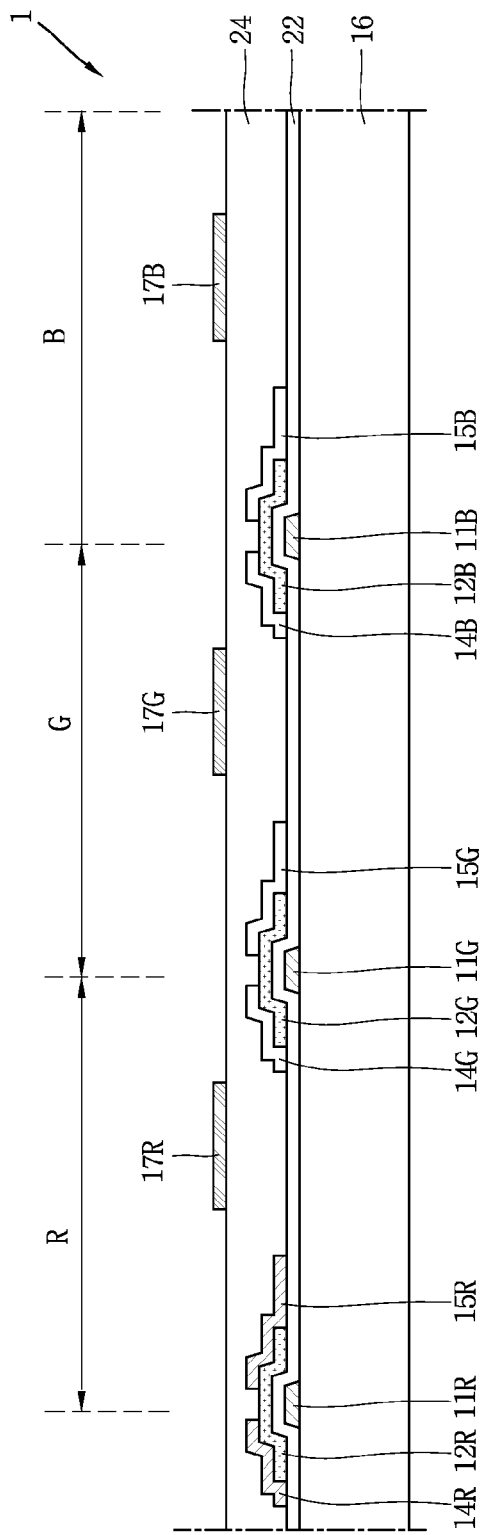

Then, as illustrated in FIG. 3B, an inorganic insulating material is deposited over the entire surface of the first substrate 16 formed with the source electrode (14R, 14G, 14B) and drain electrode (15R, 15G, 15B) to form the first insulating layer 24. For the first insulating layer 24, $SiO_2$ may be formed at a thickness of about 4500 Å. Subsequently, the R-color filter layer 17R, G-color filter layer 17G, and B-color filter layer 17B may be formed on the R, G, B pixels, respectively, on the first insulating layer 24.

Figure 3C:
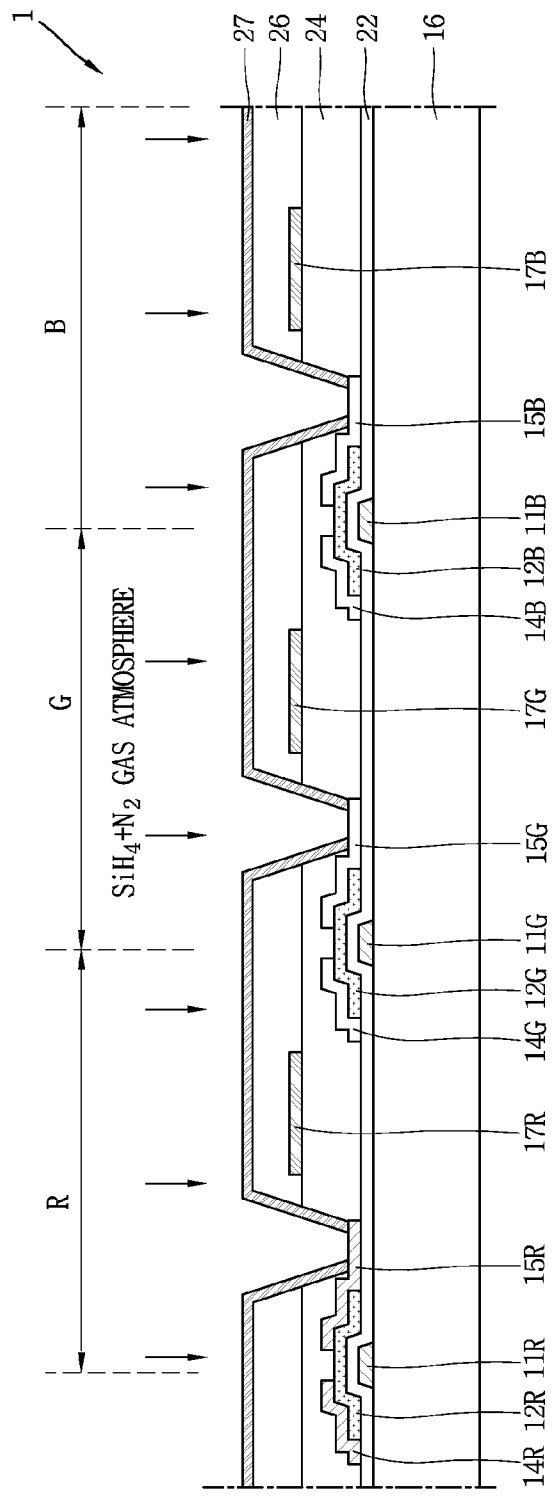

Subsequently, as illustrated in FIG. 3C, an organic insulating material such as photoacryl is coated over the entire surface of the first substrate 16 formed with the R-color filter layer 17R, G-color filter layer 17G, and B-color filter layer 17B to deposit the second insulating layer 26. Then the first insulating layer 24 and second insulating layer 26 are etched to form a contact hole 29 (see FIG. 3D) on which the drain electrode (15R, 15G, 15B) of the thin-film transistor is exposed. The second insulating layer 26 may be formed at a thickness of about 3 μm. Furthermore, though the first insulating layer 24 and second insulating layer 26 are etched at the same time to form the contact hole 29 in the drawing, the first insulating layer 24 may be etched and then the second insulating layer 26 formed therewithin may be etched to form the contact hole 29.

Subsequently, a material such as SiNx or the like is deposited on the second insulating layer 26 and then etched to form the light compensation layer 27. The light compensation layer 27 may be formed at an inner portion of the contact hole 29, but may be patterned to externally expose the drain electrode (15R, 15G, 15B).

The light compensation layer 27 is formed by a chemical vapor deposition (CVD) process. In other words, a gas mixed with $SiH_4$ and $N_2$ is supplied into the vacuum chamber, and then the CVD process is carried out to form a SiNx layer.

Of course, the SiNx layer may use a gas mixed with $SiH_4$ and $NH_3$. However, in this case, hydrogen contained in $NH_3$ infiltrates a channel layer of the thin-film transistor during the process. The infiltration of hydrogen applies a shock to the channel layer of the thin-film transistor, which appears to be a key reason of the deterioration of the thin-film transistor.

However, according to the present invention, a SiNx layer is formed using a gas mixed with $SiH_4$ and $N_2$, and thus, hydrogen does not infiltrate the channel layer of the thin-film transistor, thereby preventing a thin-film transistor from deteriorating due to hydrogen.

On the other hand, according to the present invention, a gas mixed with $SiH_4$ and $NH_3$ and a gas mixed with $SiH_4$ and $N_2$ are alternatively supplied and then the CVD process is carried out to form a SiNx layer. When forming a SiNx layer, the deposition speed of a case where a gas mixed with $SiH_4$ and $NH_3$ is supplied to perform the CVD process is faster than the deposition speed of a case where a gas mixed with $SiH_4$ and $N_2$ is alternatively supplied to perform the CVD process. Accordingly, the deposition speed is enhanced in the present invention to efficiently perform the process as well as the content of hydrogen is reduced to the maximum to prevent the deterioration of the thin-film transistor.

Figure 3D:
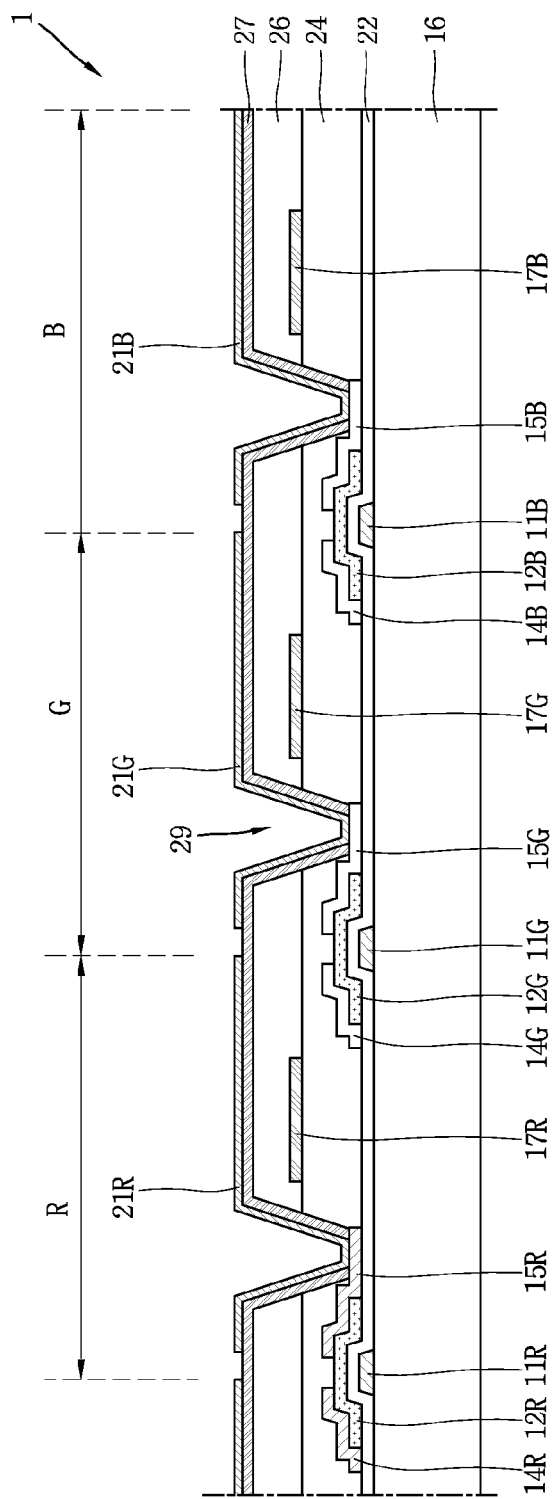

Subsequently, as illustrated in FIG. 3D, a transparent conductive material such as ITO or IZO is deposited on the light compensation layer 27 and then etched to form the pixel electrode (21R, 21G, 21B). The pixel electrode (21R, 21G, 21B) is extended to an inner portion of the contact hole 29 to electrically connect the drain electrode (15R, 15G, 15B) of the thin-film transistor. Furthermore, the pixel electrode (21R, 21G, 21B) of the relevant pixel is electrically insulated from the pixel electrode (21R, 21G, 21B) of the adjacent pixel.

Figure 3E:
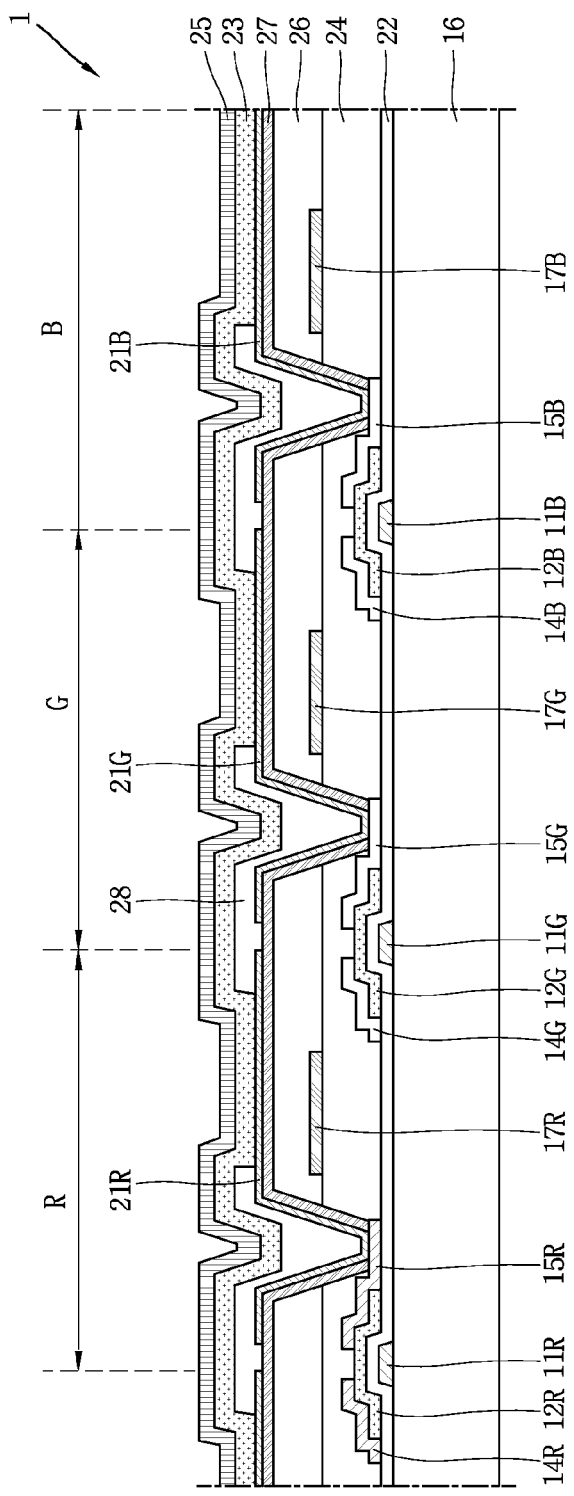

Then, as illustrated in FIG. 3E, a bank layer 28 is formed between each pixel. The bank layer 28 partitions off each pixel to prevent a specific color light outputted from the adjacent pixel from being mixed, and fills up a portion of the contact hole 29 to decrease the step. The bank layer 28 may be formed by depositing and etching an inorganic insulating material using the CVD process or may be formed by depositing an organic insulating material and then etching it.

Subsequently, the organic light emitting unit 23 is formed over the entire surface of the first substrate 16 formed with the bank layer 28 and pixel electrode (21R, 21G, 21B). The organic light emitting unit 23 is composed of an electron injection layer, an electron transport layer, a white organic light emitting layer, a hole transport layer and a hole injection layer, and the white organic light emitting layer may be a layer mixed with a R-organic light emitting material, a G-organic light emitting material, and a B-organic light emitting material, or a structure on which a R-organic light emitting layer, a G-organic light emitting layer, and a B-organic light emitting layer are deposited. The electron injection layer, electron transport layer, organic light emitting layer, hole transport layer and hole injection layer may be formed by depositing various materials currently being used.

Then, a metal such as Ca, Ba, Mg, Al, and Ag is deposited on the organic light emitting unit 23 to form the common electrode 25.

Figure 3F:
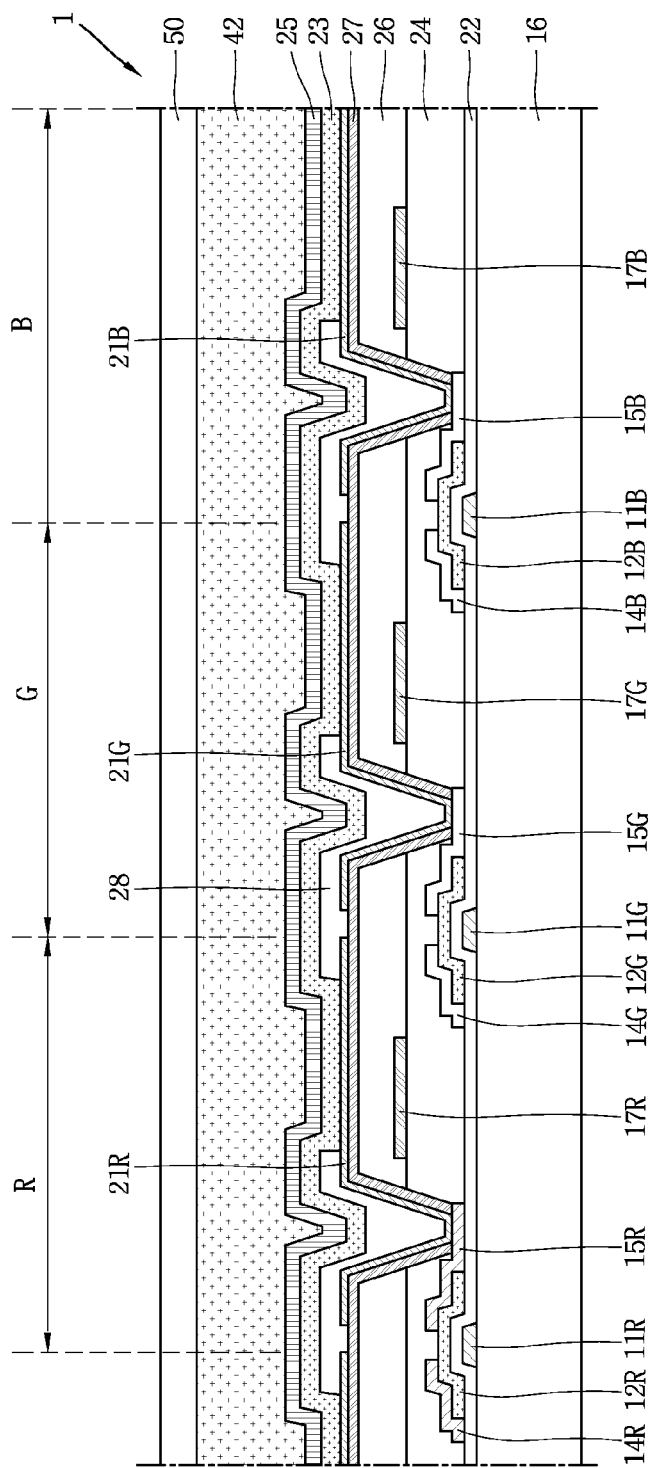

Subsequently, as illustrated in FIG. 3F, the adhesive layer 42 made of a thermosetting resin such as an epoxy-based compound, an acrylate-based compound, or acrylate-based rubber is formed over the entire surface of the second substrate 50 in a thickness of about 5 to 100 μm, and then a pressure is applied to the first substrate 10 and second substrate 50 in a state that the second substrate 50 is placed on the first substrate 16 to bond the first substrate 10 to the second substrate 50.

The adhesive agent or adhesive film is coated or deposited on the first substrate 16, and then the second substrate 50 is placed thereon to bond both of them together.

The second substrate 50 may be made of plastic or glass, or formed with a protective film such as a polystyrene (PS) film, a polyethylene (PE) film, a polyethylene naphthalate (PEN) film and a polyimide (PI) film.

As described above, the first substrate 16 and second substrate 50 are bonded together, and then the adhesive layer 42 is heated at temperatures of about 80 to 170 degrees to cure the adhesive layer 42. The organic light emitting display device is sealed by the curing of the adhesive layer 42, thereby preventing moisture from infiltrating from the outside. Furthermore, the second substrate 50 is operated as a sealing cap for sealing the organic light emitting display device to protect the organic light emitting display device.

As described above, according to the present invention, the light compensation layer 27 is formed under the light emitting unit 23 to refract light being emitted from the light emitting unit 23, thereby enhancing the color viewing angle characteristic of light that penetrates the color filter layer (17R, 17G, 17B). According to the present invention, SiNx is used for the light compensation layer 27, and the SiNx may be formed in a gas atmosphere mixed with $SiH_4$ and $N_2$ but not in a gas atmosphere mixed with $SiH_4$ and $NH_3$, thereby effectively preventing the thin-film transistor from being deteriorated due to hydrogen infiltration into the thin-film transistor.

Figure 4:
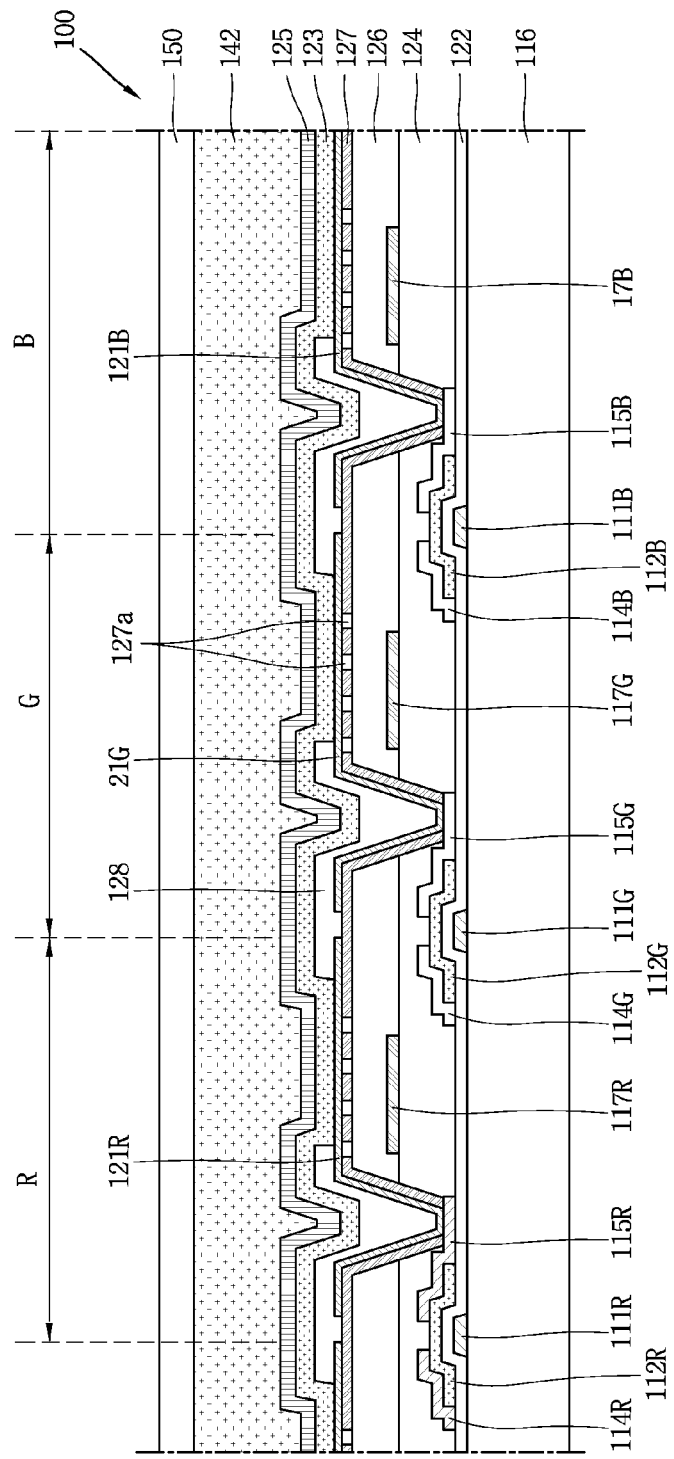
FIG. 4 is a cross-sectional view illustrating the structure of an organic light emitting display device according to a second embodiment of the present invention.

FIG. 4 is a cross-sectional view illustrating the structure of an organic light emitting display device according to a second embodiment of the present invention. The structure of the second embodiment is similar to that of the first embodiment illustrated in FIG. 2, and therefore, the same structure will be described in brief, and only the different structure will be described in detail.

As illustrated in FIG. 4, the driving thin-film transistor formed at the pixel (R, G, B) on the first substrate 116 may include a gate electrode (111R, 111G, 111B) formed at the pixel (R, G, B), respectively, on the first substrate 116, and a semiconductor layer (112R, 112G, 112B) formed on the gate electrode (111R, 111G, 111B), and a source electrode (114R, 114G, 114B) and a drain electrode (115R, 115G, 115B) formed on the semiconductor layer (112R, 112G, 112B).

A first insulating layer 124 may be formed on the first substrate 116 formed with the driving thin-film transistor. The first insulating layer 124 may be formed of an inorganic material with a thickness of about 4500 Å. A R-color filter layer 117R, a G-color filter layer 117G, and a B-color filter layer 117B are formed on the R, G, B pixels, respectively, of the first insulating layer 124.

A light compensation layer 127 is formed on the second insulating layer 126. The light compensation layer 127 is a material having a refractive index of 1.5 to 2.7, and a transparent material such as SiNx, ITO, or IZO may be used for the light compensation layer 127. The light compensation layer 127 is a layer containing no hydrogen, and may be formed in an atmosphere containing no hydrogen when forming a SiNx layer or the like, thereby preventing a thin-film transistor from being deteriorated due to hydrogen infiltrating into a channel layer of the thin-film transistor. In this embodiment, the light compensation layer 127 may also contain hydrogen.

A plurality of holes 127a are formed on the light compensation layer 127. The holes 12 7a are formed in outer wall of each pixel regions. The holes 127a discharge foreign substances produced from the second insulating layer 126 or another layer. Though details will be described later, an organic light emitting layer is formed at an upper portion of the light compensation layer 127, and a vacuum cure process for allowing underneath layers to be exposed for a predetermined period of time in a vacuum state is carried out to remove foreign substances or the like from the layers formed at a lower portion of the organic light emitting layer prior to forming the organic light emitting layer. The foreign substances produced from the second insulating layer 126 or the like during the vacuum cure process should be discharged in a gas phase to the outside, but such foreign substances cannot be discharged in case where the light compensation layer 127 is formed, thereby causing a failure.

According to the present invention, the holes 127a are formed on the light compensation layer 127, thereby allowing foreign substances produced during the vacuum cure process to be discharged through the holes 127a. The holes 127a may be formed over the entire surface of the light compensation layer 127 or may be formed only in a region of the light compensation layer 127 corresponding to the R, G, B pixels, or may be formed in a regular or irregular manner.

A pixel electrode (121R, 121G, 121B) is formed on the pixel (R, G, B), respectively, of the light compensation layer 127. A contact hole 129 is formed on the first insulating layer 124 and second insulating layer 126 of the drain electrode (115R, 115G, 115B) of the thin-film transistor formed on the pixel (R, G, B), respectively, and thus the light compensation layer 127 and pixel electrode (121R, 121G, 121B) are formed on the contact hole 129 (see FIG. 5D), and the pixel electrode (121R, 121G, 121B) is electrically connected to the exposed drain electrode (115R, 115G, 115B), respectively, of the thin-film transistor.

Furthermore, a bank layer 128 is formed at each pixel boundary region on the second insulating layer 126, and an organic light emitting unit 123 for emitting white light is formed on the light compensation layer 127 and bank layer 128. A common electrode 125 is formed over the entire surface of the first substrate 116 on the organic light emitting unit 123.

An adhesive is coated at an upper portion of the common electrode 125 to form an adhesive layer 142, and a second substrate 150 is disposed thereon, and thus the second substrate 150 is secured to the first substrate 116 by the adhesive layer 142.

FIGS. 5A through 5F are views illustrating a method of fabricating an organic light emitting display device according to a second embodiment of the present invention.

Figure 5A:
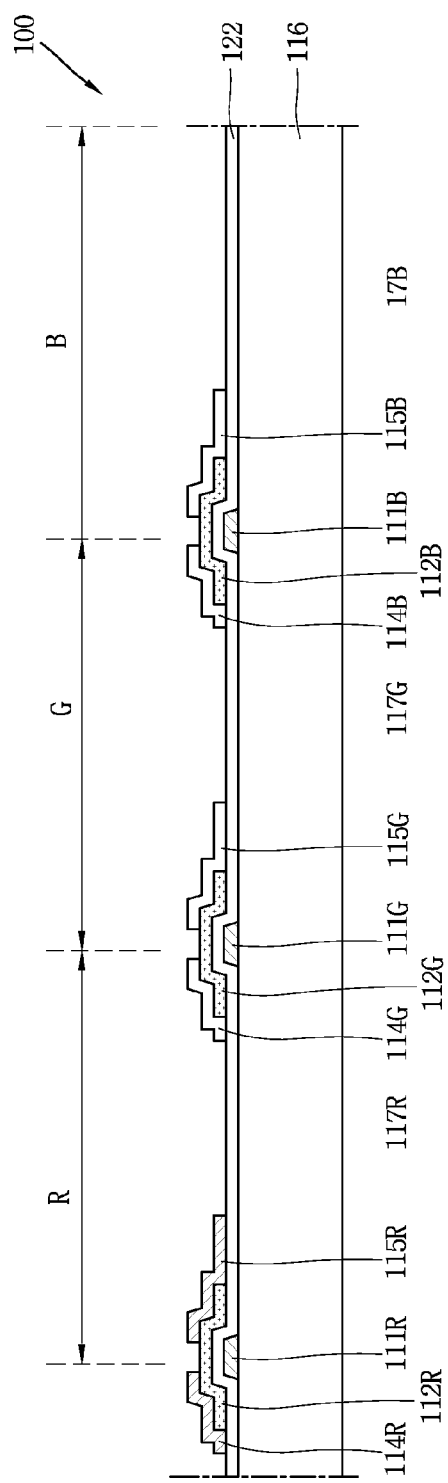

First, as illustrated in FIG. 5A, the first substrate 116 is prepared, and then a non-transparent material having a good conductivity is deposited by a sputtering process and then etched by a photolithography process to form the gate electrode (111R, 111G, 111B).

Then, an inorganic insulating material is deposited over the entire surface of the first substrate 116 by a chemical vapor deposition (CVD) process to form a gate insulating layer 122, and then a semiconductor material such as an amorphous silicon (a-Si), a transparent oxide semiconductor such as indium gallium zinc oxide (IGZO), or an organic semiconductor is deposited by the CVD process and then etched to form the semiconductor layer (112R, 112G, 112B). Furthermore, though not shown in the drawing, impurities are doped into part of the semiconductor layer (112R, 112G, 112B) or amorphous silicon to which impurities have been added is deposited to form an ohmic contact layer.

Then, a non-transparent metal having a good conductivity is deposited on the first substrate 116 by a sputtering process and then etched to form the source electrode (114R, 114G, 114B) and drain electrode (115R, 115G, 115B) on the semiconductor layer (112R, 112G, 112B), strictly speaking, on the ohmic contact layer.

Figure 5B:
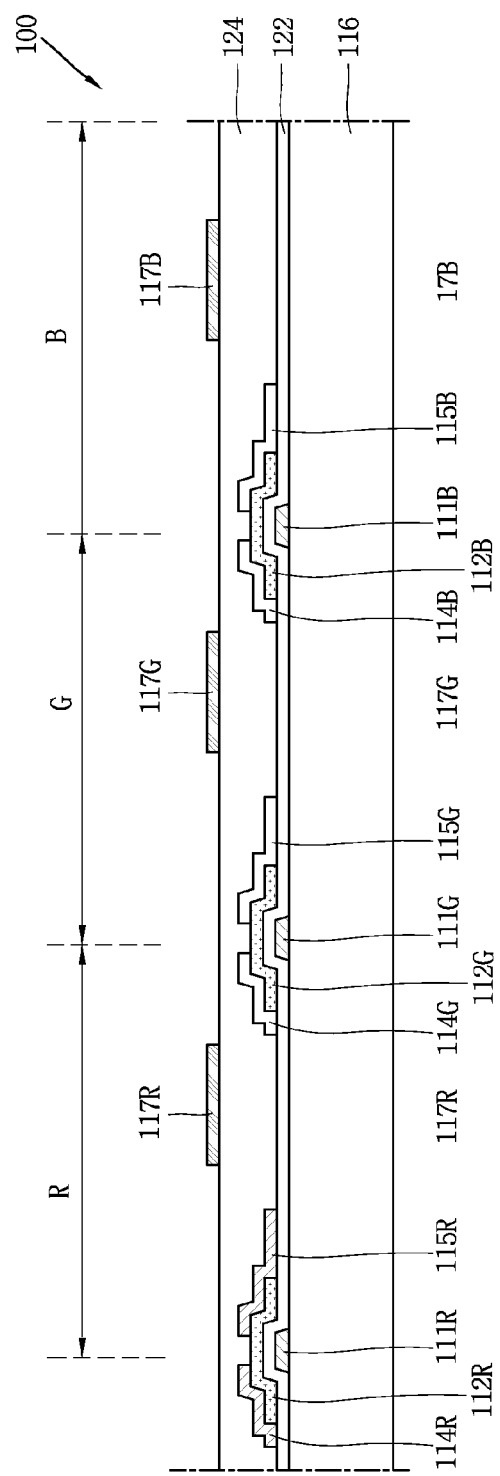

Then, as illustrated in FIG. 5B, an inorganic insulating material is deposited over the entire surface of the first substrate 116 formed with the source electrode (114R, 114G, 114B) and drain electrode (115R, 115G, 115B) to form the first insulating layer 124. Then the R-color filter layer 117R, G-color filter layer 117G, and B-color filter layer 117B may be formed on the R, G, B pixels, respectively, on the first insulating layer 124.

Subsequently, as illustrated in FIG. 5C, the second insulating layer 126 is deposited over the entire surface of the first substrate 116 formed with the R-color filter layer 117R, G-color filter layer 117G, and B-color filter layer 117B. Then the first insulating layer 124 and second insulating layer 126 are etched to form a contact hole 129 on which the drain electrode (115R, 115G, 115B) of the thin-film transistor is exposed. Though the first insulating layer 124 and second insulating layer 126 are etched at the same time to form the contact hole 129 in the drawing, the first insulating layer 124 may be formed and the contact hole is formed and then the second insulating layer 126 formed again and then the second insulating layer 126 is etched to form the contact hole, thereby forming the contact hole 129 formed on the first insulating layer 124 and second insulating layer 126.

Subsequently, a material such as SiNx or the like is deposited on the second insulating layer 126 and then etched to form the light compensation layer 127. Then a plurality of holes 127a are formed on the light compensation layer 127. The holes 127a are formed only in a region corresponding to the R, G, B pixels in the drawing, but may be formed over the entire surface of the light compensation layer 127.

The light compensation layer 127 is formed by a CVD process. In other words, a gas mixed with $SiH_4$ and $NH_3$ may be supplied into the vacuum chamber and then the CVD process may be carried out to form a SiNx layer, or a gas mixed with $SiH_4$ and $N_2$ may be supplied and then the CVD process may be carried out to form a SiNx layer. Otherwise, a gas mixed with $SiH_4$ and $N_2$ and a gas mixed with $SiH_4$ and $N_2$ may be alternatively supplied and then the CVD process may be carried out to form a SiNx layer.

Figure 5D:
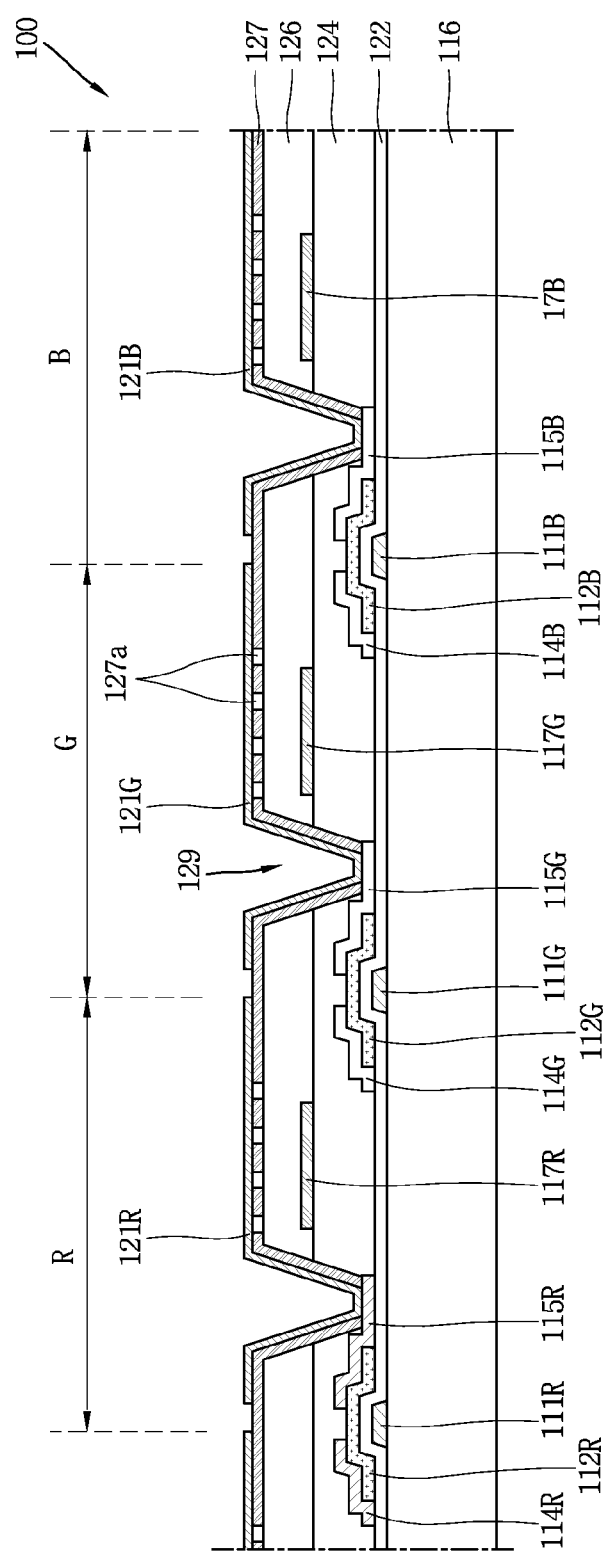

Subsequently, as illustrated in FIG. 5D, a transparent conductive material such as ITO or IZO is deposited on the light compensation layer 127 and then etched to form the pixel electrode (121R, 121G, 121B).

Figure 5E:
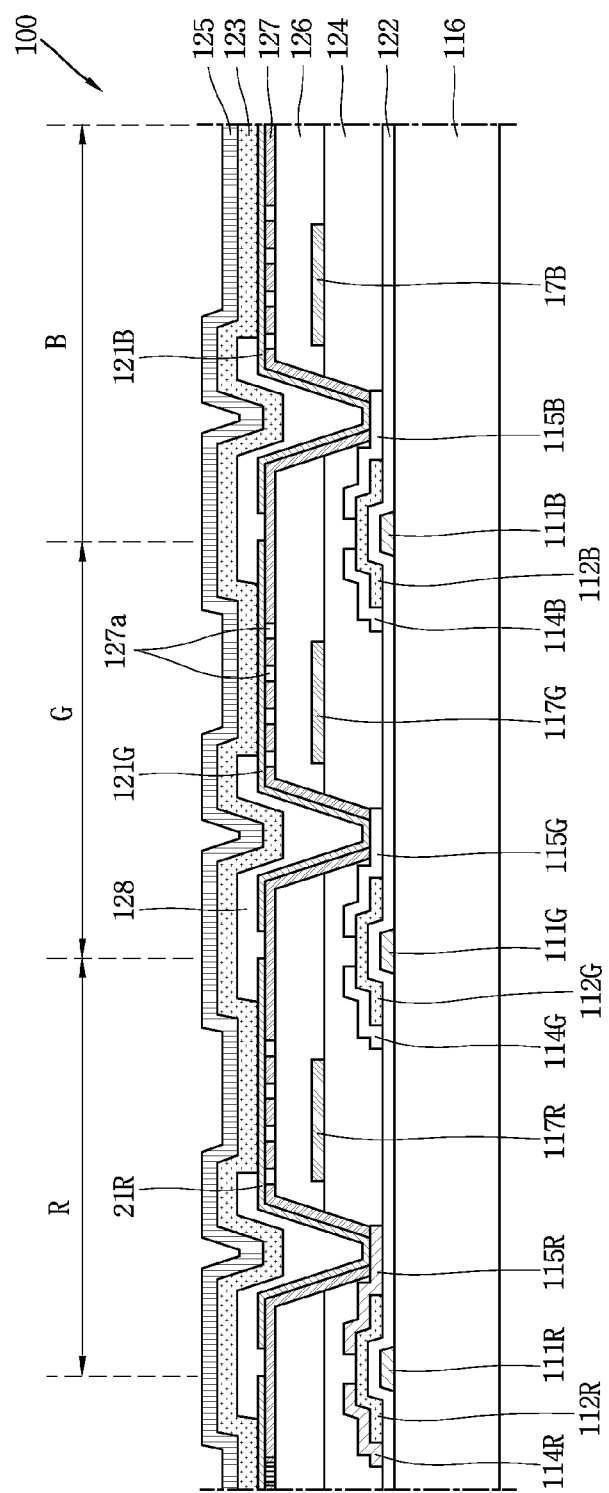

Then, as illustrated in FIG. 5E, a bank layer 128 is formed between each pixel, and then the organic light emitting unit 123 is formed over the entire surface of the first substrate 116 formed with the bank layer 128 and pixel electrode (121R, 121G, 121B). The organic light emitting unit 23 is composed of an electron injection layer, an electron transport layer, a white organic light emitting layer, a hole transport layer and a hole injection layer, and the white organic light emitting layer may be a layer mixed with a R-organic light emitting material, a G-organic light emitting material, and a B-organic light emitting material, or a structure on which a R-organic light emitting layer, a G-organic light emitting layer, and a B-organic light emitting layer are deposited. The electron injection layer, electron transport layer, organic light emitting layer, hole transport layer and hole injection layer may be formed by depositing various materials currently being used.

Though not shown in FIG. 5E, the fabricated layer is exposed in a vacuum state for a predetermined period of time subsequent to the formation of the bank layer 128 and prior to the formation of the organic light emitting unit 123 to perform vacuum curing.

Then, a metal such as Ca, Ba, Mg, Al, and Ag is deposited on the organic light emitting unit 123 to form the common electrode 125.

Subsequently, as illustrated in FIG. 5F, an adhesive layer 142 is formed over the entire surface of the second substrate 150. Then pressure is applied to the first substrate 116 and second substrate 150 in a state that the second substrate 150 is placed on the first substrate 116 to bond the first substrate 116 to the second substrate 150. The adhesive agent or adhesive film is coated or deposited on the first substrate 116. Then the second substrate 150 is placed thereon to bond both of them together.

As described above, the first substrate 116 and second substrate 150 are bonded together. Then the adhesive layer 140 is cured by heating at temperatures of about 80 to 170 degrees, thereby finishing the organic light emitting display device.

The organic light emitting display device having a specific structure has been disclosed as an organic light emitting display device in the foregoing detailed description, but the present invention is not be limited to the organic light emitting display device having such a specific structure.

For example, the organic light emitting unit is composed of an electron injection layer, an electron transport layer, an organic light emitting layer, a hole transport layer, and a hole injection layer in the foregoing description, but the organic light emitting unit may be formed only with an organic light emitting layer or formed only with an electron injection layer and an organic light emitting layer. Furthermore, the organic light emitting unit may be formed only with an organic light emitting layer and a hole injection layer, and other various configurations are also available.

In other words, if a configuration such as the formation of a light compensation layer in which the content of hydrogen is minimized, a plurality of holes formed on the light compensation layer, or the like, which is a key gist of the present invention, is merely included therein, it may be applicable to all kinds of organic light emitting display devices with a widely known structure.

What is claimed is:

1. An organic light emitting display device, comprising:
a first substrate and a second substrate comprising a plurality of pixels;
a thin-film transistor formed on the first substrate;
a first insulating layer formed on the first substrate including the thin-film transistor;
a color filter layer formed on the first insulating layer in a pixel region;
a second insulating layer formed on the first substrate including the color filter layer;
a light compensation layer formed on the second insulating layer and made of a material without hydrogen, wherein the light compensation layer comes into contact with a pad of a drain of the thin-film transistor;
a plurality of holes formed on the light compensation layer to expose the second insulating layer therethrough to discharge foreign substances, wherein the holes are formed in an outer wall of each pixel regions;
a pixel electrode formed on the light compensation layer of each pixel region;

an organic light emitting unit formed on the pixel electrode to emit light; and a common electrode formed on the organic light emitting unit, wherein the light compensation layer is made of material having a refractive index of 1.5-2.7 to refract the light from the color filter layer.

2. The organic light emitting display device of claim 1, wherein the light compensation layer is made of a transparent material.

3. The organic light emitting display device of claim 2, wherein the light compensation layer is formed of a material selected from a group consisting of SiNx, indium tin oxide (ITO), and indium zinc oxide (IZO).

4. The organic light emitting display device of claim 3, wherein the SiNx is deposited with a thickness of 1500 to 2000 Å.

5. The organic light emitting display device of claim 4, wherein the plurality of holes are formed in a region corresponding to the color filter.

6. The organic light emitting display device of claim 4, wherein the plurality of holes are formed in a region corresponding to the color filter and within a color filter region.

* * * * *